(12) United States Patent
Yoon et al.

(10) Patent No.: US 7,981,263 B2
(45) Date of Patent: Jul. 19, 2011

(54) SPUTTERING APPARATUS, METHOD OF DRIVING THE SAME, AND METHOD OF MANUFACTURING SUBSTRATE USING THE SAME

(75) Inventors: Hyuk Sang Yoon, Goyang-si (KR); Hwan Kyu Yoo, Osan-si (KR); Byung Han Yun, Daegu (KR)

(73) Assignee: LG Display Co., Ltd., Seoul (KR)

( * ) Notice: Subject to any disclaimer, the term of this patent is extended or adjusted under 35 U.S.C. 154(b) by 1088 days.

(21) Appl. No.: 11/797,775

(22) Filed: May 7, 2007

(65) Prior Publication Data

US 2007/0256933 A1 Nov. 8, 2007

(30) Foreign Application Priority Data

May 8, 2006 (KR) ........................ 10-2006-0040954

(51) Int. Cl.
*C25B 9/00* (2006.01)
*C25B 11/00* (2006.01)
*C25B 13/00* (2006.01)
*C23C 14/00* (2006.01)

(52) U.S. Cl. ........... 204/298.28; 204/298.18; 204/298.2; 204/298.23

(58) Field of Classification Search ............. 204/192.12, 204/298.28, 298.18, 298.2, 298.23
See application file for complete search history.

(56) References Cited

U.S. PATENT DOCUMENTS

| 6,800,183 B2 * | 10/2004 | Takahashi | 204/298.28 |
| 6,964,731 B1 * | 11/2005 | Krisko et al. | 204/192.12 |
| 2004/0231973 A1 | 11/2004 | Sato et al. | |

FOREIGN PATENT DOCUMENTS

| CN | 1572900 | 2/2005 |
| JP | 11-209872 | 8/1999 |
| JP | 2004-346387 | 12/2004 |

\* cited by examiner

*Primary Examiner* — Alexa D Neckel
*Assistant Examiner* — Michael Band
(74) *Attorney, Agent, or Firm* — McKenna Long & Aldridge LLP (57) ABSTRACT

A sputtering apparatus includes a susceptor having a substrate and a plurality of target devices facing the substrate and substantially parallel to each other, each target device being rotatable.

14 Claims, 6 Drawing Sheets

SPUTTERING APPARATUS, METHOD OF DRIVING THE SAME, AND METHOD OF MANUFACTURING SUBSTRATE USING THE SAME

This application claims the benefit of Korean Patent Application No. 2006-040954, filed on May 8, 2006, which is hereby incorporated by reference for all purposes as if fully set forth herein.

BACKGROUND OF THE INVENTION

1. Field of the Invention

The present invention relates to a processing apparatus, and more particularly, to a sputtering apparatus capable of easily processing a large-area substrate, a method of driving the sputtering apparatus, and a method of manufacturing a substrate using the sputtering apparatus.

2. Discussion of the Related Art

A substrate, such as a semiconductor wafer or a display panel (such as a liquid crystal display (LCD) device or a plasma display panel (PDP)), is manufactured by repeatedly performing a plurality of processes such as deposition and etching. Each process uses a separate processing apparatus. Among the apparatuses, there are sputtering apparatuses for deposition.

Figure 1:
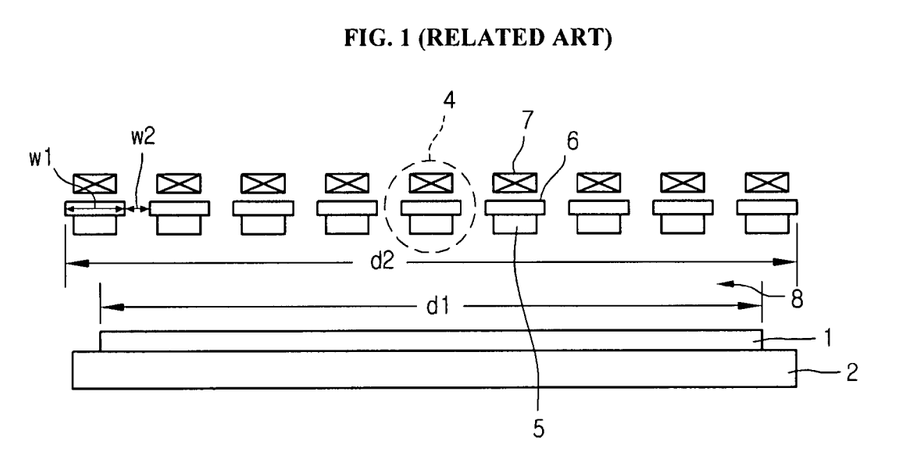
FIG. 1 illustrates a sectional view of a sputtering apparatus according to the related art.

FIG. 1 illustrates a sectional view of a sputtering apparatus according to the related art.

Referring to FIG. 1, the sputtering apparatus includes a susceptor 2 having a substrate securely seated thereon and a plurality of target devices 4. The target devices 4 face the susceptor 2 or the substrate 1 and are arranged in a line on the same surface. Each target device 4 includes a target 5, a baking plate 6 and a magnet 7. The target 5 emits target particles and is fixed on the front surface of the baking plate 6 that faces the susceptor 2. The baking plate 6 supports the target 5 and maintains the temperature of the target 5 to a constant room temperature. The magnet 7 on the rear surface of the baking plate 6 allows electrons to collect to facilitate a plasma discharge in an internal space 8 between the target 5 and the susceptor 2.

The following describes an operation of the above sputtering apparatus. An inert gas, such as Ar gas, fills the internal space 8 between the target 5 and the susceptor 2. When a predetermined positive voltage is supplied to the susceptor 2 and a predetermined negative voltage is supplied to the target 5, Ar gas is ionized to Ar+ ions to generate plasma. Because more electrons are collected by the magnetic field of the magnet 7, the generated plasma becomes high-density plasma. A region of the high-density plasma contains $Ar^+$ ions. A predetermined potential difference occurs between the region of the high-density plasma and the target 5. The $Ar^+$ ions contained in the high-density plasma region are accelerated by the energy of the predetermined potential difference and thus collide against the target 5. These collisions cause the target 5 to emit target particles, and the emitted target particles are deposited on the substrate 1.

With a recent increase in the size of a substrate to be processed, the requirements on a sputtering apparatus for processing such a substrate have also increased.

In particular, the number of the target devices 4 needed increases with increased substrate size, thereby increasing the cost and size of the sputtering apparatus. In the related art, the width "w2" of a gap between adjacent target devices 4 is controlled to be very small (the width "w2" being much smaller than the width "w1" of the target device 4) so that target particles substantially uniformly deposit on the substrate 1, thereby requiring a large number of target devices. In addition, in order to substantially uniformly deposit target particles on an edge region of the substrate 1, target devices 4 are provided such that the total width "d2" of the target devices 4 is greater than the width "d1" of the substrate 1. Accordingly, the size of the sputtering apparatus further increases and thus the occupation area of the sputtering apparatus further increases.

Figure 2:
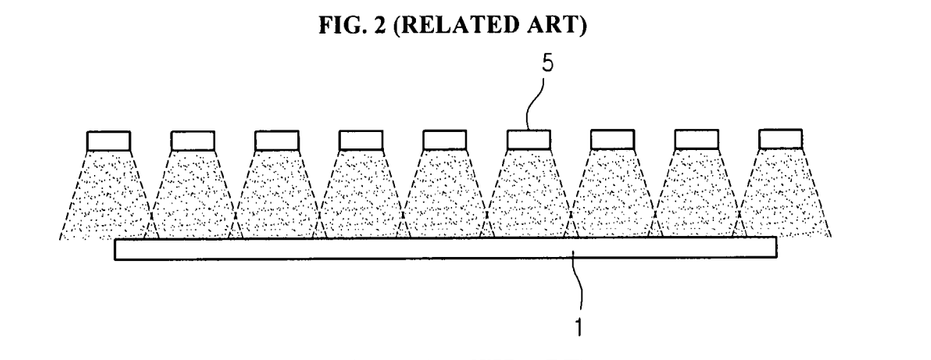
FIG. 2 illustrates a schematic sectional view showing the propagation directions of target particles emitted from targets of the related art sputtering apparatus.
Figure 3:
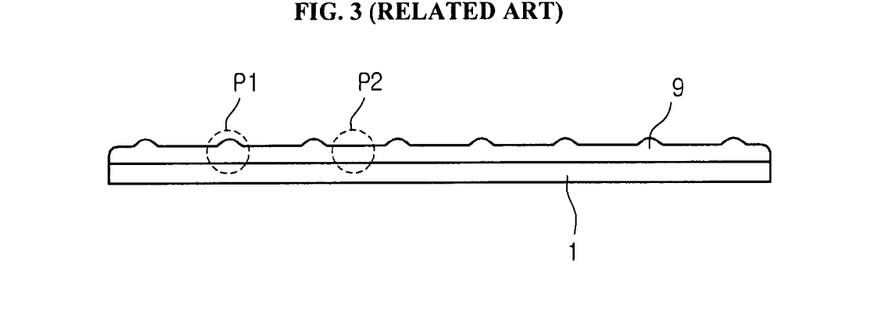
FIG. 3 illustrates a schematic sectional view showing the shape of a layer formed on a substrate manufactured using the related art sputtering apparatus.

Further, target devices 4 are securely fixed to an external wall or a support such that the target devices 4 cannot shift or rotate in any direction (e.g., a vertical direction or a horizontal direction). Accordingly, target particles emitted from each target 5 are deposited mainly on the portion of the substrate 1 opposite to each target 5. That is, as shown in FIG. 2, $Ar^+$ ions located in front of the target 5 collide with the target, and target particles are emitted from the target 5 by the above collision. The emitted target particles are slightly spread and deposited on the facing substrate 1. At a boundary region between adjacent targets, emitted target particles are deposited on the substrate 1 from both of the adjacent targets. Accordingly, as shown in FIG. 3, more target particles are deposited on a first region p1 of the substrate 1, which is opposite to the boundary region between the adjacent targets 5, than on a second region p2 of the substrate 1, which is opposite to the target 5. Consequently, a layer 9 formed on the substrate 1 has an uneven surface.

The substrate 1 having the uneven layer 9 formed thereon, may be poor in terms of operation characteristics and image-quality characteristics.

SUMMARY OF THE INVENTION

Accordingly, the present invention is directed to a sputtering apparatus, a method of driving the same, and a method of manufacturing a substrate using the same that substantially obviate one or more problems due to limitations and disadvantages of the related art.

An advantage of the present invention is to provide a sputtering apparatus with a reduced size, a method of driving the same, and a method of manufacturing a substrate using the same.

Another advantage of the present invention is to provide a sputtering apparatus capable of reducing costs, a method of driving the same, and a method of manufacturing a substrate using the same.

An additional advantage of the present invention is to provide a sputtering apparatus capable of providing substantially uniformity, a method of driving the same, and a method of manufacturing a substrate using the same.

Additional advantages and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these and other advantages and in accordance with the purpose of the invention, as embodied and broadly described herein, there is provided a sputtering apparatus including: a susceptor having a substrate; and a plurality of target devices facing the substrate and substantially parallel to each other, each target device being rotatable.

In another aspect of the present invention, there is provided a sputtering apparatus including: a susceptor having a substrate; and a plurality of target devices facing the substrate and substantially parallel to each other, the target devices being shiftable in a direction substantially parallel to the substrate.

In another aspect of the present invention, there is provided a method of driving a sputtering apparatus, which includes a susceptor having a substrate and a plurality of target devices facing the substrate and substantially parallel to each other, the method including: rotating each target device on a shaft installed in each target device in a first direction during a first driving period; and rotating each target device on the shaft in a second direction during a second driving period.

In another aspect of the present invention, there is provided a method of driving a sputtering apparatus, which include a susceptor having a substrate and a plurality of target devices facing the substrate and substantially parallel to each other, the method including: rotating each target device on a shaft installed in each target device in a first random direction during a first driving period; and rotating each target device on the shaft in a second random direction during a second driving period.

In another aspect of the present invention, there is provided a method of manufacturing a substrate using a sputtering apparatus include a susceptor and a plurality of target devices facing the susceptor and substantially parallel to each other, the method including: providing the substrate on the susceptor; rotating each target device on a shaft installed in each target device; and processing the substrate using the rotated target devices.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE ILLUSTRATED EMBODIMENTS

Reference will now be made in detail to embodiments of the present invention, examples of which are illustrated in the accompanying drawings. Wherever possible, the same reference numbers will be used throughout the drawings to refer to the same or like parts.

Figure 4:
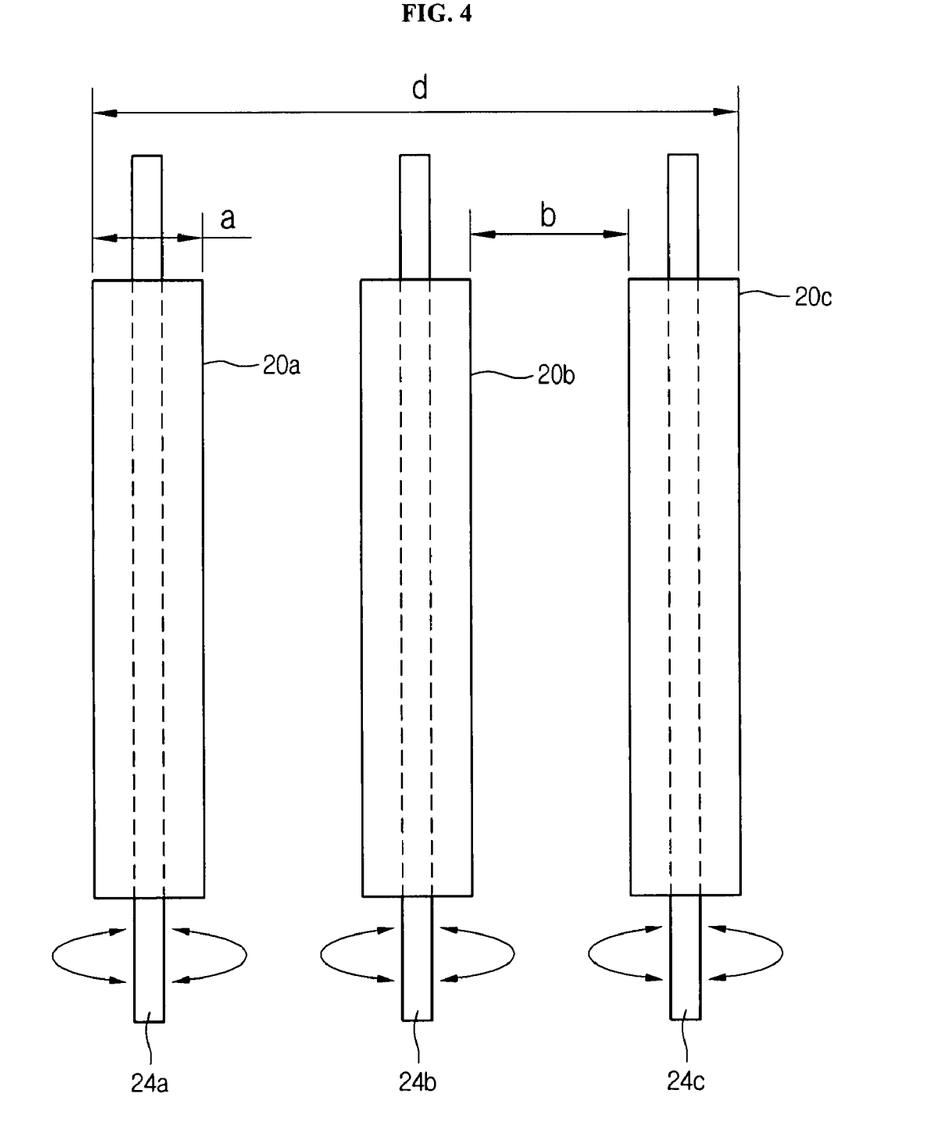
FIG. 4 illustrates a schematic plan view of a sputtering apparatus according to an embodiment of present invention.
Figure 5:
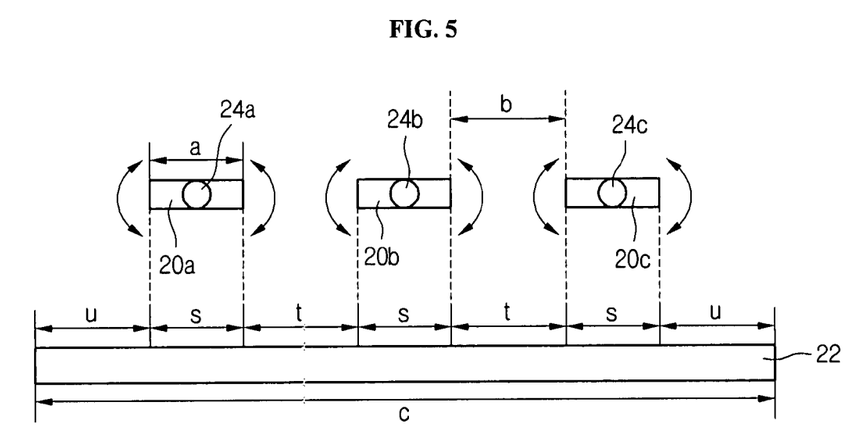
FIG. 5 illustrates a schematic sectional view of the sputtering apparatus according to an embodiment of the present invention.

FIG. 4 illustrates a plan view of a sputtering apparatus according to an embodiment of the present invention, and FIG. 5 is a sectional view of the sputtering apparatus.

Referring to FIGS. 4 and 5, the sputtering apparatus may include a susceptor (not shown) and a plurality of target devices 20a, 20b and 20c. Substrate 22 may be securely seated on the susceptor. Each target device 20a, 20b, 20c may face the susceptor or substrate 22. Each target device 20a, 20b and 20c may include a target, a baking plate, and a magnet. The target may emit target particles, the baking plate may maintain the temperature of the target to a constant room temperature, and the magnet may induce formation of high-density plasma. A predetermined positive voltage may be supplied to the susceptor, and a predetermined negative voltage may be supplied to the target.

Each target device 20a, 20b and 20c may rotate. Each target device 20a, 20b and 20c may rotate respectively on shafts 24a, 24b and 24c, which may be substantially parallel to the substrate 22. Shafts 24a, 24b and 24c may be in each target device 20a, 20b and 20c.

Each target device 20a, 20b and 20c may rotate in a first direction and may rotate in a second direction. Accordingly, target particles may be emitted from each target device 20a, 20b and 20c in the first and second directions and thus the emitted target particles may be substantially uniformly deposited on the substrate 22. Therefore, the substrate 22 may be manufactured to have a layer with high reliability and substantially uniformity.

In addition, the emitted target particles may be deposited on the substrate 22 more widely in the first or second directions. Therefore, the width of a gap between each target device 20a, 20b and 20c may be increased and the total width of the target devices 20a, 20b and 20c may be decreased, while maintaining a substantially uniform layer on the entire region of the substrate 22. Accordingly, the required number of target devices may be minimized and thus the manufacturing cost and the occupation area may be minimized.

Each target device 20a, 20b and 20c may have a substantially rectangular shape elongating in one direction. Alternatively, each target device 20a, 20b and 20c may have a substantially square shape. Each target device 20a, 20b and 20c may include rounded edges. Each target device 20a, 20b and 20c may be arranged substantially parallel to each other. In addition, any plurality or only a single target device may be used in the sputtering apparatus.

Each target device 20a, 20b and 20c may rotate on shafts 24a, 24b and 24c in a first direction or a second direction, for example the clockwise or counterclockwise direction. Shafts 24a, 24b and 24c may elongate along the longitudinal direction of each target device 20a, 20b and 20c. Shafts 24a, 24b and 24c may be installed in each target device 20a, 20b and 20c in such a way that the shafts 24a, 24b and 24c may be spaced apart from the substrate 22 by a predetermined distance. Accordingly, the predetermined distance may correspond to the distance between the substrate 22 and the target devices 20a, 20b and 20c.

For example, when the target device 20a rotates clockwise, target particles emitted from each target of target device 20a may be deposited on the substrate 22 at a second region "u" that is located on the left hand of a first region "s" opposite to the target device 20a. On the contrary, when the target device 20a rotates counterclockwise, target particles emitted from each target of target device 20a may be deposited on the substrate 22 at a third region "t" that is located on the right hand of the first region "s" opposite to the target device 20a.

Each target device 20a, 20b and 20c may rotate clockwise and counterclockwise alternately.

Because each target device 20a, 20b, and 20c may rotate in the first and second directions, the total width "d" of the target devices 20a, 20b and 20c may be smaller than the width "c" of the substrate 22. In this case, a sufficient and substantially uniform layer may be formed by the edge target devices 20a, 20b and 20c on the edge regions "u" of the substrate 22.

In addition, the width "b" of a gap between the target devices 20a, 20b and 20c may be greater than the width "a" of each target device 20a, 20b and 20c. That is, although the width "b" may be greater than the width "a", a sufficient and substantially uniform layer may be formed on the entire region of the substrate 22.

Because each target device 20a, 20b and 20c may rotate, target particles may continuously deposit on the second and third regions "u" and "t" of the substrate 22 as well as on the first regions "s" of the substrate 22, making it possible to form an substantially uniform layer on the substrate 22.

Consequently, due to the rotations of each target device 20a, 20b and 20c, a substantially uniform and reliable layer may be formed on all the regions "s", "t" and "u" of the substrate 22.

Hereinafter, the operations of the target devices 20a, 20b and 20c according to the embodiments of the present invention will be described in detail with reference to FIGS. 6 to 12.

Figure 6:
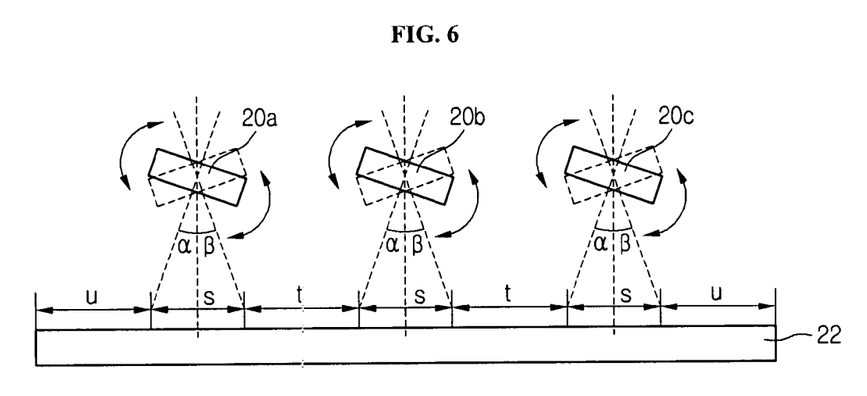
FIG. 6 illustrates a schematic sectional view showing rotations of target devices according to an embodiment of the present invention.

FIG. 6 illustrates a schematic sectional view showing rotations of target devices according to an embodiment of the present invention.

Referring to FIG. 6, first, second and third target devices 20a, 20b and 20c may rotate in the same direction by the same rotation angle. For example, all of the first, second and third target devices 20a, 20b and 20c may rotate clockwise by a first rotation angle "α" during the first driving period and may rotate counterclockwise by a second rotation angle "β" during the second driving period. The first rotation angle "α" may be substantially identical in size to the second rotation angle "β". When the first and second rotation angles "α" and "β" are substantially identical in size, a substantially uniform layer may be formed also on the second and third regions "u" and "t" located respectively on the left and right hands of the first region "s" of the substrate 22 opposite to the target device 20a, 20b and 20c.

The first and second rotation angles "α" and "β" may be in the range of approximately 0° to approximately 45°. When the first and second rotation angles "α" and "β" are greater than 45°, an interference may occur between the adjacent target devices, which may obstruct the formation of an substantially uniform layer.

Figure 7:
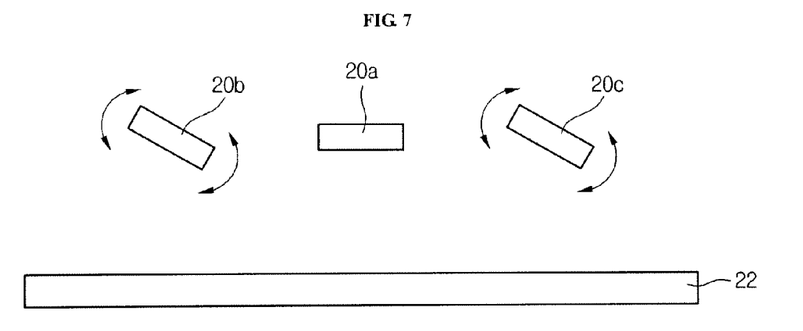
FIG. 7 illustrates a schematic sectional view showing a second embodiment in which a center target device may be fixed and edge target devices may rotate.

FIG. 7 illustrates a schematic sectional view showing an embodiment in which a center target device may be fixed and edge target devices may rotate.

Referring to FIG. 7, a first target device 20a opposite to a center region of a substrate 22 cannot rotate, while second and third target devices 20b and 20c opposite respectively to edge regions of the substrate 22 may rotate. The second and third target devices 20b and 20c may rotate in the same direction by the same rotation angle, or may rotate in the opposite directions by the same rotation angle. For example, both of the second and third target devices 20b and 20c rotate clockwise or counterclockwise. Alternatively, the second target device 20b rotates clockwise, while the third target device 20c rotates counterclockwise.

In this case, the clockwise rotation angle may be substantially identical in size to the counterclockwise rotation angle.

For convenience of description, FIG. 7 shows that the first target device 20a may be provided in singularity. However, for a large-area substrate, the first target device 20a may be provided in plurality. Likewise, if necessary, each of the second and third target devices 20b and 20c may be provided in plurality.

Figure 8:
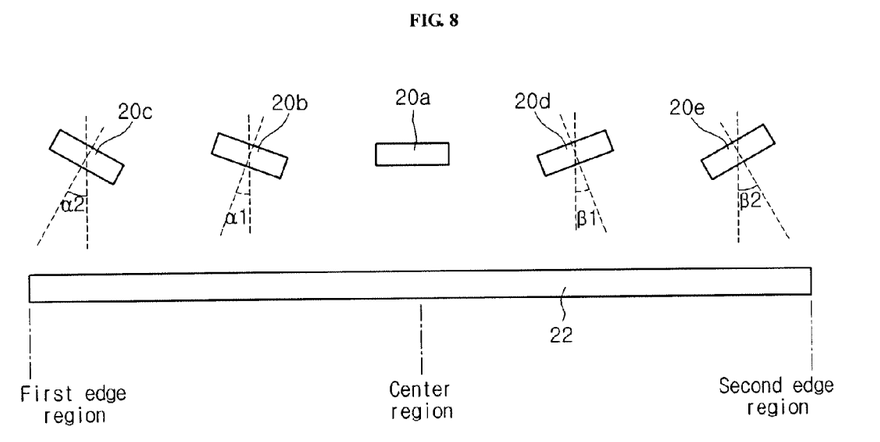
FIG. 8 illustrates a schematic sectional view showing a third embodiment in which the rotation angles of target devices may increase from center to edge.

FIG. 8 illustrates a schematic sectional view showing an embodiment in which the rotation angles of target devices increase from center to edge.

Referring to FIG. 8, a first target device 20a opposite to a center region of a substrate 22 may be fixed and the rotation angles of second to fifth target devices 20b to 20e may increase from the center region to the edge region of the substrate 22. Each of the first to fifth target devices 20a to 20e may be provided in plurality. The second and third target devices 20b and 20c opposite to a left edge region of the substrate 22 and the fourth and fifth target device 20d and 20e opposite to a right edge region of the substrate 22 may rotate in the same direction or in the opposite directions.

For example, the first target device 20a is not rotatable, the second target device 20b adjacent to the center region of the substrate 22 rotates clockwise by a first rotation angle "α1", and the third target device 20c adjacent to the edge region of the substrate 22 rotates clockwise by a second rotation angle "α2".

Likewise, the fourth target device 20d adjacent to the center region of the substrate 22 rotates counterclockwise by a third rotation angle "β1", and the fifth target device 20e adjacent to the edge region of the substrate 22 rotates counterclockwise by a fourth rotation angle "β2". The second rotation angle "α2" may be greater than the first rotation angle "α1", and the fourth rotation angle "β2" may be greater than the third rotation angle "β1". The first and third rotation angles "α1" and "β1" may be substantially identical in size and the second and fourth rotation angles "α2" and "β2" may be substantially identical in size. That is, the opposite target devices, which may be spaced apart from the center of the substrate 22 by the same distance, may rotate by the same-sized rotation angle.

The second and fourth target devices 20b and 20d may rotate by the same-sized rotation angle in the same direction or in the opposite directions. That is, the first and third rotation angles "α1" and "β1" may be substantially identical in size.

Likewise, the third and fifth target devices 20c and 20e may rotate by the same-sized rotation angle in the same direction or in the opposite directions. That is, the second and fourth rotation angles "α2" and "β2" may be substantially identical in size.

At this point, the second and third target devices 20b and 20c and the fourth and fifth target devices 20d and 20e may all rotate in the same direction, or may rotate in the opposite directions.

For example, all of the second to fifth target devices 20b to 20e rotate clockwise during the first driving period and counterclockwise during the second driving period.

Alternatively, the second and third target devices 20b and 20c rotates clockwise and simultaneously the fourth and fifth target device 20d and 20e rotates counterclockwise during the first driving period, while the second and third target devices 20b and 20c rotates counterclockwise and simultaneously the fourth and fifth target devices 20d and 20e rotates clockwise during the second driving period.

Figure 9:
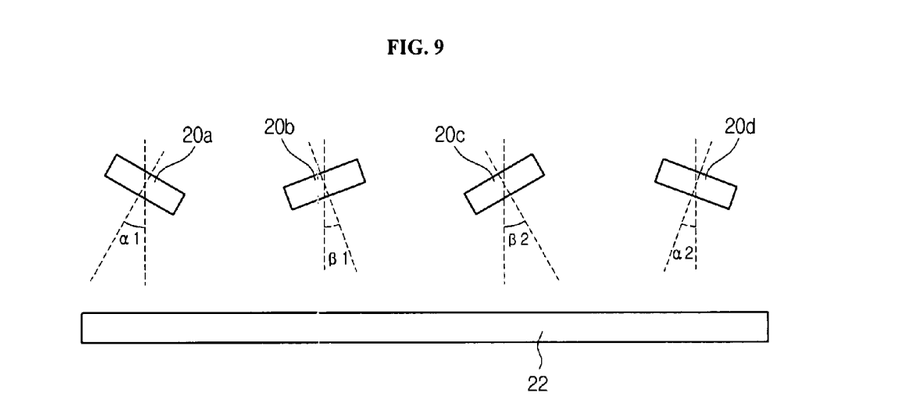
FIG. 9 illustrates a schematic sectional view showing a fourth embodiment in which target devices may rotate randomly.

FIG. 9 illustrates a schematic sectional view showing an embodiment in which target devices may rotate randomly.

Referring to FIG. 9, first to fourth target devices 20a to 20d may rotate in a random direction by a random rotation angle. For example, the first target device 20a rotates clockwise by a first rotation angle "α1", the second target device 20b rotates counterclockwise by a second rotation angle "β1", the third target device 20c rotates counterclockwise by a third rotation angle "β2", and the fourth target device 20d rotates clockwise by a fourth rotation angle "α2".

Figure 10:
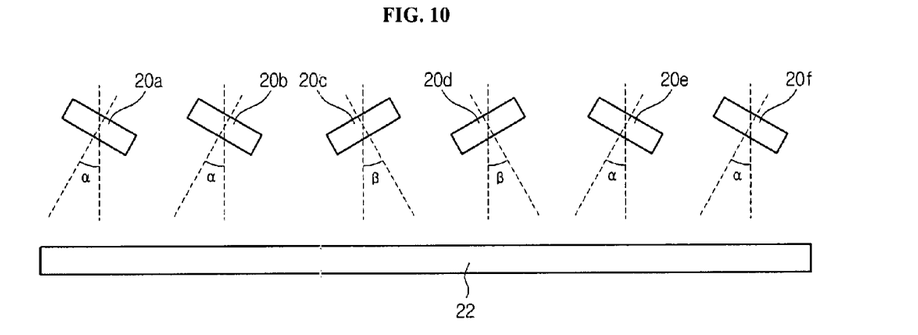
FIG. 10 illustrates a schematic sectional view showing a fifth embodiment in which target devices may rotate in pairs.

FIG. 10 illustrates a schematic sectional view showing an embodiment in which target devices may rotate in pairs. It should be noted that the target devices may rotate in groups, each group including at least two of the target devices.

Referring to FIG. 10, first to sixth target devices 20a to 20f may rotate in pairs in such a way that the paired target devices rotate in the same direction and by the same rotation angle. For example, the first and second target devices 20a and 20b rotate clockwise by a first rotation angle "α", the third and fourth target devices 20c and 20d rotate counterclockwise by a second rotation angle "β", and the fifth and sixth target device 20e and 20f rotates clockwise by the first rotation angle "β". The first and second rotation angles "α" and "β" may be substantially identical in size.

Figure 11:
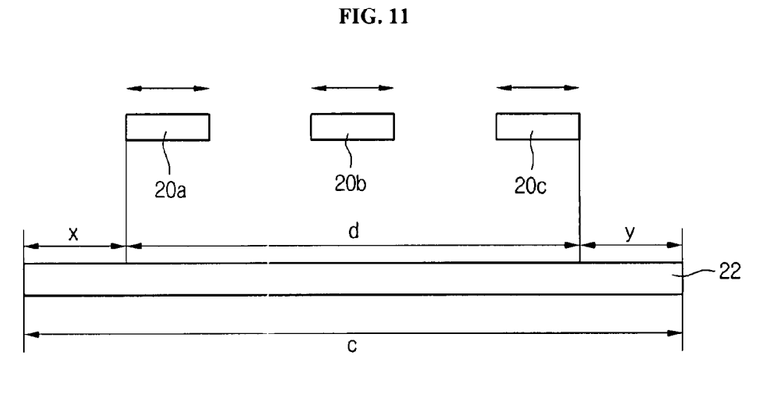
FIG. 11 illustrates a schematic sectional view showing a sixth embodiment in which target devices may shift.

FIG. 11 illustrates a schematic sectional view showing an embodiment in which target device may shift.

Referring to FIG. 11, a plurality of target devices 20a to 20c may shift in a direction substantially parallel to a substrate 22. Each target device 20a to 20c may shift in the same direction. For example, each target device 20a to 20c shift in the left direction from a center region of the substrate 22 during the first driving period, while each target device 20a to 20c may shift in the right direction from the center region of the substrate 22 during the second driving period. According to circumstances, the target devices 20a to 20c may shift or stop. The total width "d" of the target devices 20a to 20c may be smaller than the width "c" of the substrate 22 so that there is no target device opposite to an edge region of the substrate 22. When the target devices 20a to 20c are shifted in the left direction from the center region of the substrate 22, because the shifted target device 20a is opposite to a left edge region "x" of the substrate 22, target particles emitted from the shifted target device 20a may be deposited on the left edge region "x" of the substrate 22. Likewise, when the target devices 20a to 20c are shifted in the right direction from the center region of the substrate 22, because the shifted target device 20c may be opposite to a right edge region "y" of the substrate 22, target particles emitted from the shifted target device 20c may be deposited on the right edge region "y" of the substrate 22.

Because the target devices 20a to 20c may shift in a direction substantially parallel to the substrate 22 as described above, a substantially uniform layer may be formed on the substrate 22 although the number of target devices may be small.

Figure 12:
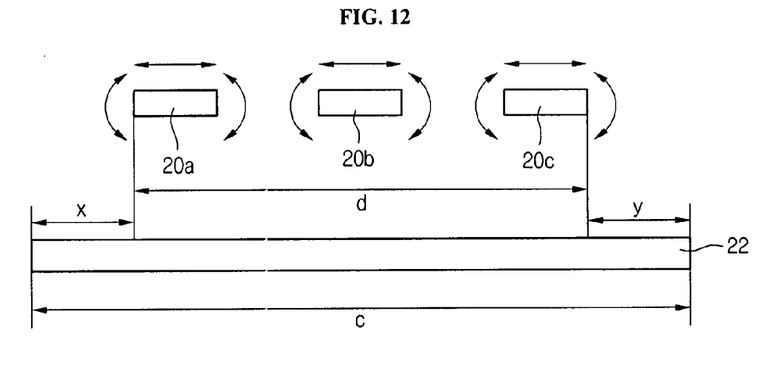
FIG. 12 illustrates a schematic sectional view showing a seventh embodiment in which target devices may rotate and shift.

FIG. 12 is a schematic sectional view showing an embodiment in which target devices may rotate and shift.

Referring to FIG. 12, target devices 20a to 20c may rotate clockwise or counterclockwise and shift in the direction substantially parallel to the substrate 22. The seventh embodiment (FIG. 12) can be understood as a combination of the first embodiment (FIG. 6) and the sixth embodiment (FIG. 11). For example, when the target devices 20a, 20b and 20c shift in the left direction from a center region of the substrate 22 and in the direction substantially parallel to the substrate 22 and rotate during the first driving period, target particles may be substantially uniformly deposited on a left edge region "x" of the substrate 22. Likewise, when the target device 20a, 20b and 20c shift in the right direction from the center region of the substrate 22 and in a direction substantially parallel to the substrate 22 and rotate during the second driving period, target particles may be substantially uniformly deposited on a right edge region "y" of the substrate 22. The total width "d" of the target devices 20a to 20c may be smaller than the width "c" of the substrate 22. When the sputtering device is continuously driven in the same way as above, a substantially uniform layer may be formed on a relatively wide substrate using a relatively small number of target devices.

As described above, by rotating or shifting the target devices, the embodiments of the present invention relatively reduces the total width of the target devices in relation to the width of the substrate, thereby making it possible to reduce the size of the sputtering apparatus.

Also, by rotating or shifting the target devices, the embodiments of the present invention relatively reduces the total width of the target devices and thus the number of target devices, thereby making it possible to reduce the manufacturing cost.

Also, the embodiments of the present invention can form the target particles emitted from the target devices substantially uniformly on the substrate, thereby achieving the substantially uniformity of the substrate.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A sputtering apparatus comprising:
a susceptor having a substrate; and
a plurality of target devices disposed forward of the substrate,
wherein the target devices include first to fifth targets,
wherein the first target device opposite to a center region of the substrate is fixed, and the second to fifth target devices opposite to a region between a first or second edge region and the center region of the substrate rotate, wherein the rotation angles of the second to fifth target devices increase from the center region to the edge region of the substrate,
wherein the second and third target devices are opposite to the region between the first edge region and the center region of the substrate, the third target device being nearer to the first edge region than the second target device, and the fourth and fifth target devices are opposite to the region between the second edge region and the center region of the substrate, the fifth target device being nearer to the second edge region than the fourth target device.

2. The sputtering apparatus according to claim 1, wherein a total width of the target devices is smaller than a width of the substrate.

3. The apparatus according to claim 1, wherein a width of each target device is smaller than a width of a gap between the target devices.

4. The apparatus according to claim 1, wherein the rotation angle of the third target device is greater than the rotation angle of the second target device, and the rotation angle of the fifth target device is greater than the rotation angle of the fourth target device.

5. The apparatus according to claim 1, wherein the second to fifth target devices rotate in substantially the same direction.

6. The apparatus according to claim 1, wherein the second and third target devices and the fourth and fifth target devices rotate in substantially opposite directions.

7. The apparatus according to claim 1, wherein each target device rotates in a random direction.

8. The apparatus according to claim 1, wherein each target device rotates by a random rotation angle.

9. The apparatus according to claim 1, wherein each target device rotates in groups, each group including at least two of the target devices, wherein the grouped target devices rotate in substantially the same direction.

10. The apparatus according to claim 9, wherein the groups include a first group and a second group, the first group and the second group, adjacent to each other, rotate in substantially the same direction.

11. The apparatus according to claim 9, wherein the first group and the second group, adjacent to each other, rotate in substantially opposite directions.

12. The apparatus according to claim 1, wherein each target device rotates by substantially the same rotation angle.

13. The apparatus according to claim 1, wherein each target device shifts in a direction substantially parallel to the substrate.

14. The apparatus according to claim 13, wherein each target device shifts in a first direction or in a second direction from a center region of the substrate.

* * * * *

UNITED STATES PATENT AND TRADEMARK OFFICE
CERTIFICATE OF CORRECTION

PATENT NO. : 7,981,263 B2  
APPLICATION NO. : 11/797775  
DATED : July 19, 2011  
INVENTOR(S) : Hyuk Sang Yoon

Page 1 of 1

It is certified that error appears in the above-identified patent and that said Letters Patent is hereby corrected as shown below:

Title page, item (73) Assignees should read:

LG Display Co., Ltd., Seoul, Korea  
AVACO Co., Ltd., Daegu-Si, Korea  
LG Electronics, Inc., Seoul, Korea Signed and Sealed this  
Tenth Day of July, 2012

David J. Kappos  
*Director of the United States Patent and Trademark Office*